(12) United States Patent
Chen

(10) Patent No.: US 6,432,780 B2
(45) Date of Patent: Aug. 13, 2002

(54) METHOD FOR SUPPRESSING BORON PENETRATING GATE DIELECTRIC LAYER BY PULSED NITROGEN PLASMA DOPING

(76) Inventor: Wei-Wen Chen, No. 16, Li Hsing Rd., Science-Based Industrial Park, Hsinchu (TW)

( * ) Notice: Subject to any disclaimer, the term of this patent is extended or adjusted under 35 U.S.C. 154(b) by 0 days.

(21) Appl. No.: 09/795,936

(22) Filed: Feb. 28, 2001

(30) Foreign Application Priority Data

Jan. 30, 2000 (TW) ........................................ 90101834 A

(51) Int. Cl.⁷ .......................................... H01L 23/3205
(52) U.S. Cl. ...................... 438/287; 438/591; 438/513; 438/528
(58) Field of Search ................................ 438/162, 197, 438/216, 261, 287, 299, 303, 407, 423, 440, 513, 516, 520, 528, 530, 585, 591, 595, 766, 769

(56) References Cited

U.S. PATENT DOCUMENTS 6,093,661 A * 7/2000 Trivedi et al. .............. 438/769

* cited by examiner

*Primary Examiner*—Chandra Chaudhari
*Assistant Examiner*—Jack Chen
(74) *Attorney, Agent, or Firm*—Powell Goldstein; Frazer & Murphy LLP

(57) ABSTRACT

A method for suppressing boron penetrating the gate dielectric layer by pulsed nitrogen plasma doping. A pulsed nitrogen plasma doping process is utilized to dope nitrogen ions into the surface layer in the channel region of the semiconductor substrate. A thermal oxidation step is then performed to form a gate dielectric layer commixed with oxide and oxynitride over the channel region of the semiconductor substrate to avoid boron penetration effect accruing while a boron doped polysilicon layer is subsequently formed on the gate dielectric layer.

23 Claims, 2 Drawing Sheets

METHOD FOR SUPPRESSING BORON PENETRATING GATE DIELECTRIC LAYER BY PULSED NITROGEN PLASMA DOPING

FIELD OF THE INVENTION

The present invention relates to a method of fabricating a semiconductor device, and more particular to a method for suppressing boron penetrating the gate dielectric layer by pulsed nitrogen plasma doping.

BACKGROUND OF THE INVENTION

Fabrication of metal-oxide-semiconductor (MOS) transistors is well-known for the skills in the art. The manufacturing process begins by lightly doping a single crystalline silicon substrate with n-type or p-type species. Active areas of the substrate in which the transistors and other active devices will reside are then isolated from other active areas with isolation structures. Isolation structures may comprise shallow trenches in the substrate that are filled with a dielectric. Isolation structures may alternatively comprise local oxidation of silicon (LOCOS) structures. A gate dielectric layer (i.e., silicon dioxide) is then formed upon the substrate by thermally oxidizing the silicon-based substrate. A gate conductor is formed by depositing polysilicon upon the gate dielectric, followed by patterning the polysilicon using typical masking and etching techniques. Subsequently, the polysilicon gate conductor and source/drain regions arranged within the substrate on opposite sides of the gate conductor are concurrently doped with a high dosage of n-type or p-type dopants. If the impurity dopant is p-type, then the resulting transistor is referred to as a PMOS device.

The resistivity of the polysilicon gate conductor is reduced by the introduction of impurities into the structure. Enough dopants are introduced so that the sheet resistance of the gate conductor is reduced to, in some instances, less than approximately 500 ohms/sq. In an ion implantation process, the depth at which the dopants are implanted can be controlled by adjusting the energy provided to the ions by the ion implantation equipment. However, the minimum depth of implantation is limited to between 200 .ANG. and 400 . ANG., because the energy of each ion is typically too large to permit a lesser depth of implantation.

Subsequent processing steps may require heating of the semiconductor topography. For example, a post-implant anneal is often performed to position and activate the dopants implanted into the source/drain regions and the gate conductor. Dopants with a high diffusivity typically migrate to greater depths within the polysilicon gate than dopants with a low diffusivity. For instance, boron which is commonly used to dope the polysilicon gate and the source/drain regions of a PMOS device undergoes fast diffusion. Unfortunately, boron readily migrates during heat treatment and may diffuse from the gate conductor through the gate oxide and into the channel region of the transistor. Boron penetration into the channel can lead to undesirable effects, such as an increase in electron trapping, a decrease in low-field hole mobility, degradation of the transistor drive current, and increased subthreshold current.

Hence, while critical dimension is scaling down to 0.18 $\mu$m, the thickness of the gate dielectric layer is thinner than 20 ANG., and therefore, boron penetration effect is more significant. It is important to suppressing boron penetration through the gate dielectric layer into the device channel region that causes threshold voltage change and effects device operation.

SUMMARY OF THE INVENTION

The present invention provides a method of suppressing boron penetrating a gate dielectric layer by pulsed nitrogen plasma doping, comprising the following steps. A semiconductor substrate having a channel region is provided. A pulsed nitrogen plasma doping step is then performed to dope nitrogen ions into the surface layer in the channel region. A nitrogen annealing step is optionally performed after the pulsed nitrogen plasma doping step to enhance the doping result of nitrogen ions. A thermal oxidation step is performed to form a gate dielectric layer commixed with oxide and oxynitride over the channel region of the semiconductor substrate.

According to the method of fabricating the gate dielectric layer of the present invention, an oxynitride containing thin film is formed over the channel region. Since the nitrogen ions doped in the surface layer in the channel region can produce a dense structure to provide a barrier to effectively suppress boron penetrating through the gate dielectric layer into the channel region, and therefore, electric property change of transistors causing from boron penetrating can be prevented.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED DRAWINGS

Figure 1A:
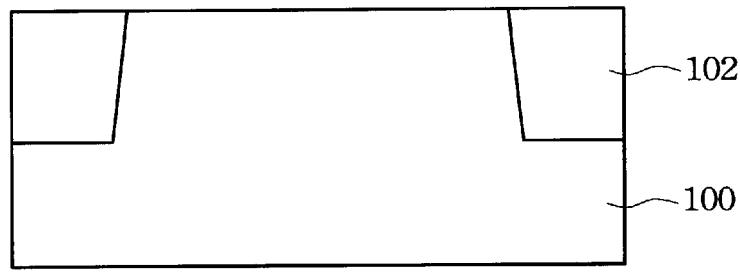
FIGS. 1A–1D are schematic, cross-sectional views of one preferred embodiment of the present invention.

Referring to FIG. 1A, a semiconductor substrate 100, such as single crystal silicon substrate is provided. A plurality of device isolations 102 are then formed in the substrate 100 to scheme location of transistors in active regions between device isolations 102, wherein the active regions comprise channel regions of each transistor. The device isolations 102 comprise the local oxidation of silicon (LOCOS) structures or shallow trench isolations (STI).

Figure 1B:
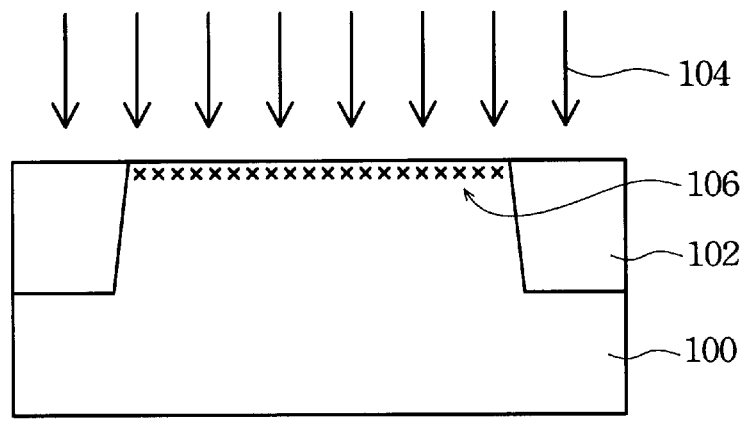

Referring to FIG. 1B, a pulsed nitrogen plasma doping step 104 is performed by utilizing nitrogen plasma to pulse-dope nitrogen ions into the surface layer in the active regions (comprising channel regions). Compared with the traditional ion implanting process, the pulsed nitrogen plasma doping of the present invention can get less doping depth, such as shallower than 50 ANG. The nitrogen ions 106 doped into the substrate 100 almost stay in the surface layer of the substrate 100, and therefore, fewer damage is created on the substrate 100. This is rewarding to maintain perfection of the interface between the substrate 100 and the gate dielectric layer subsequently formed on the substrate 100. In addition, if only the channel regions are needed to dope nitrogen ions 106, a photoresist layer may be formed on the substrate 100 to only expose the channel regions, and then the pulsed nitrogen plasma doping is sequently performed.

Figure 2:
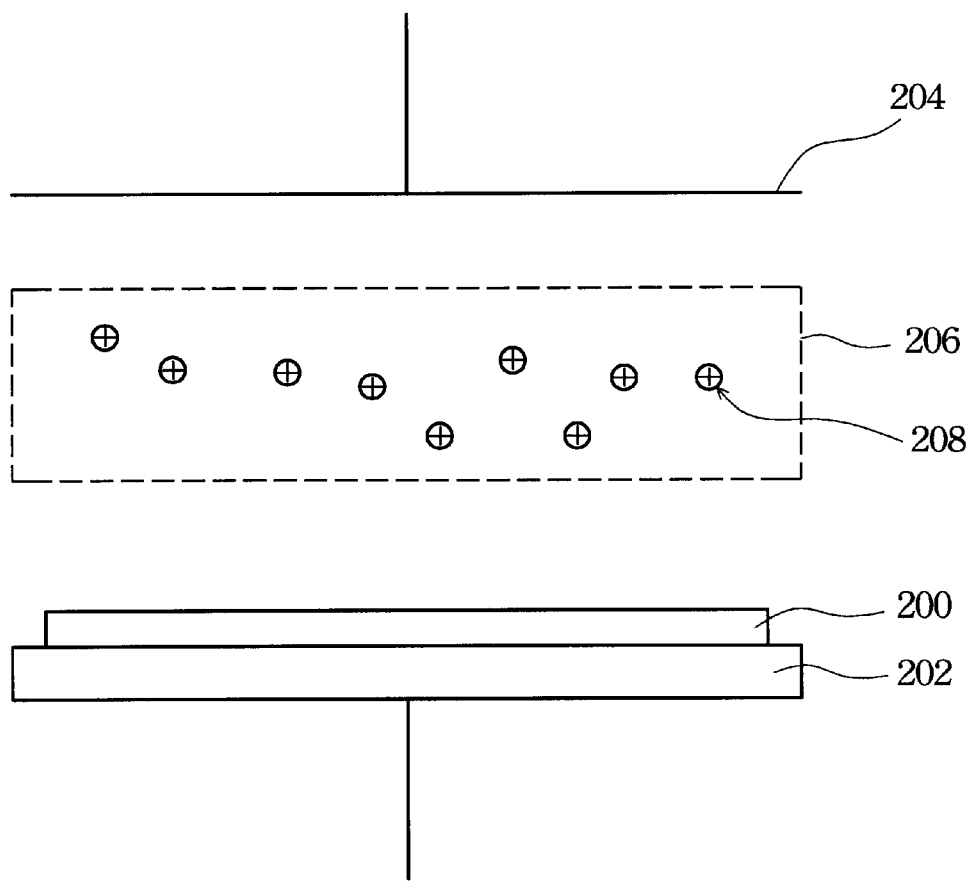
FIG. 2 is a schematic view of equipment structure of pulsed nitrogen plasma doping.

The pulsed nitrogen plasma doping is further described in detail in the following description. Referring to FIG. 2, it is a schematic view of equipment structure of pulsed nitrogen plasma doping. The reaction chamber in the equipment mainly comprises a lower electrode 202 and an upper electrode 204, and a wafer 200 comprising the semiconductor substrate 100 is deposed and mounted on the lower electrode 202. A nitrogen containing gas, such as nitrogen gas, is injected into the reaction chamber and flowed between the lower and upper electrode 202, 204. Likewise, nitrogen gas mixed with carrier gas, such as argon, can be injected into the reaction chamber to serve as reaction gas. A negative voltage is applied on the lower electrode 202 in accompany with a positive voltage applied on the upper electrode 204 to make nitrogen containing gas decompose to generate plasma 206 with positive nitrogen ions 208. The positive nitrogen ions 208 are then attracted with the negative lower electrode 202 and move forward to be implanted into the wafer 200. In the preferred embodiment, pulsed voltage is applied on the lower electrode 202 to control the plasma. The process parameters in the pulsed nitrogen plasma doping are controlled in the following ranges. The energy of pulsed nitrogen plasma doping is about 200–10000eV, and the dosage is about $1E14–1E17/cm^2$. Suitable operating in accordance with other parameters, such as gas species, gas pressure, gas flow rate, voltage bias, distance between lower and upper electrode 202, 204, and reaction time, this can make better doping resulting.

After the pulsed nitrogen plasma doping, a nitrogen annealing step can be optionally performed to enhance doping resulting. At a temperature of about 800–1100° C., pure nitrogen gas, i.e. purity is about 100%, is injected into the reaction chamber. The nitrogen annealing step is performed to active the doped nitrogen ions 106 and recondition the wafer surface damaged in the doping step.

Figure 1C:
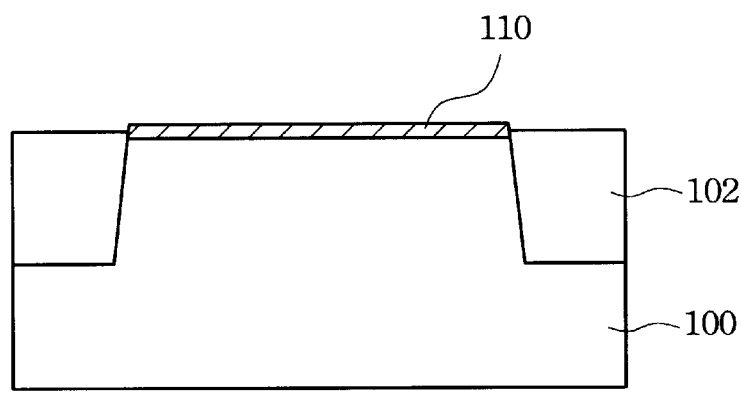

Referring to FIG. 1C, a thermal oxidation step 108 is then performed by utilizing traditional thermal oxidation, such as dry oxidation, to oxidize the silicon substrate 100, and therefore a gate dielectric layer 110 comprising silicon dioxide is grown on the substrate 100. Since the nitrogen ions 106 are doped into the surface layer of the substrate 100 prior to the thermal oxidation step 108, an oxynitride layer is produced in the lower portion of the gate dielectric layer 110. Therefore, the gate dielectric layer 110 is a commixed layer with oxide in the upper portion and oxynitride in the lower portion. Moreover, the thermal oxidation step 108 can recondition forward damages from nitrogen doping. If the nitrogen annealing step is performed, a commixed structure with nitride, oxynitride, and oxide stacked in sequence is therefore formed. Since the lower oxynitride layer has closer and denser structure than the oxide layer, boron can be effectively defensed and therefore boron penetration can be suppressed.

Figure 1D:
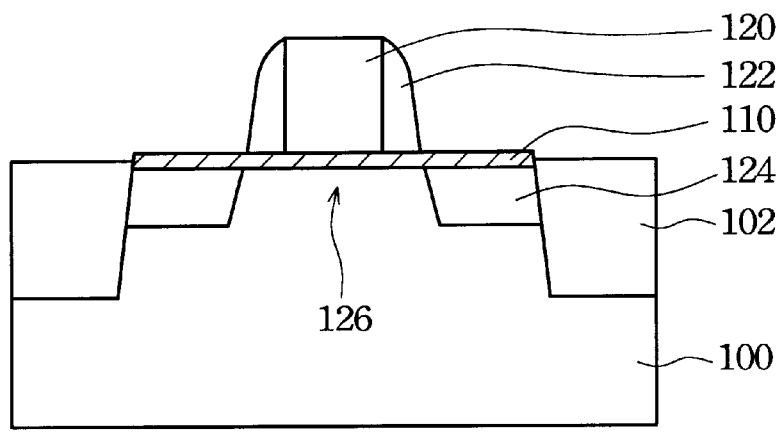

Referring to FIG. 1D, further processes are continued to complete PMOS transistor. For example, a boron doped polysilicon layer is formed over the channel region 126 to serve as gate conductive layer 120. A gate spacer 122 is then formed on the sidewall of the gate conductive layer 120, and a source/drain region 124 is formed on both sides of the gate conductive layer 120. Since these are well known for those skilled in the art, they will not be discussed in detail. Moreover, the technology in the present invention can also be applied to PMOS transistor relative device, such as complementary metal-oxide-semiconductor (CMOS) transistor.

According to above description, the present invention discloses a method for suppressing boron penetrating a gate dielectric layer by pulsed nitrogen plasma doping. Nitrogen ions can be doped into extremely shallow surface layer to reduce damage caused from nitrogen doping by pulsed nitrogen plasma doping of the present invention to maintain perfection of interface between the substrate and the gate dielectric layer. The gate dielectric layer of the present invention including oxynitride or nitride can produce closed and densed structure, and therefore can effectively defense boron penetrating the gate dielectric layer into channel region to affect electrical properties of the transistors.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for suppressing boron penetrating a gate dielectric layer by pulsed nitrogen plasma doping, comprising the sequential steps of:

providing a semiconductor substrate having a channel region, wherein the semiconductor substrate has an exposed top surface;

performing a pulsed nitrogen plasma doping step to dope nitrogen ions into the exposed top surface of the channel region; and performing a thermal oxidation step to form a gate dielectric layer over the channel region of the semiconductor substrate.

2. The method according to claim 1, wherein an energy used in the pulsed nitrogen plasma doping step is about 200–10000 eV.

3. The method according to claim 1, wherein a dosage of nitrogen ions doped into the exposed top surface of the channel region is about $1E14–1E17/cm^2$.

4. The method according to claim 1, further comprising an annealing step after the pulsed nitrogen plasma doping step.

5. The method according to claim 4, wherein nitrogen is introduced in the annealing step.

6. The method according to claim 5, wherein a purity of the nitrogen is 100%.

7. The method according to claim 4, wherein the annealing step is at 800–1100° C.

8. The method according to claim 1, wherein the gate dielectric layer is a commixed layer of oxide and oxynitride.

9. A method for suppressing boron penetrating a gate dielectric layer by pulsed nitrogen plasma doping, comprising the sequential steps of:

providing a semiconductor substrate having a channel region, wherein the semiconductor substrate has an exposed top surface;

performing a pulsed nitrogen plasma doping step to dope nitrogen ions into the exposed top surface of the channel region;

performing a nitrogen annealing step; and performing a thermal oxidation step to form a gate dielectric layer over the channel region of the semiconductor substrate.

10. The method according to claim 9, wherein an energy used in the pulsed nitrogen plasma doping step is about 200–10000 eV.

11. The method according to claim 9, wherein a dosage of nitrogen ions doped into the exposed top surface of the channel region is about $1E14–1E17/cm^2$.

12. The method according to claim 9, wherein nitrogen is introduced in the nitrogen annealing step.

13. The method according to claim 12, wherein a purity of the nitrogen is 100%.

14. The method according to claim 9, wherein the nitrogen annealing step is at 800–1100° C.

15. The method according to claim 1, wherein the gate dielectric layer is a commixed layer of oxide and oxynitride.

16. A method for fabricating a PMOS transistor, at least comprising the sequential steps of:
   providing a semiconductor substrate having a channel region, wherein the semiconductor substrate has an exposed top surface;
   performing a pulsed nitrogen plasma doping step to dope nitrogen ions into the exposed top surface of the channel region;
   performing a thermal oxidation step to form a gate dielectric layer over the channel region of the semiconductor substrate;
   forming a boron doped polysilicon layer over the channel region of the semiconductor substrate; and
   forming a source/drain region in the semiconductor substrate and on both sides of the boron doped polysilicon layer.

17. The method according to claim 16, wherein an energy used in the pulsed nitrogen plasma doping step is about 200–10000 eV.

18. The method according to claim 16, wherein a dosage of nitrogen ions doped into the exposed top surface of the channel region is about $1E14-1E17/cm^2$.

19. The method according to claim 16, further comprising an annealing step after the pulsed nitrogen plasma doping step.

20. The method according to claim 19, wherein nitrogen is introduced in the annealing step.

21. The method according to claim 20, wherein a purity of the nitrogen is 100%.

22. The method according to claim 19, wherein the annealing step is at 800–1100° C.

23. The method according to claim 16, wherein the gate dielectric layer is a commixed layer of oxide and oxynitride.

* * * * *